(12) United States Patent
Cheng et al.

(10) Patent No.: US 11,121,100 B2
(45) Date of Patent: Sep. 14, 2021

(54) TRAP LAYER SUBSTRATE STACKING TECHNIQUE TO IMPROVE PERFORMANCE FOR RF DEVICES

(71) Applicant: Taiwan Semiconductor Manufacturing Co., Ltd., Hsin-Chu (TW)

(72) Inventors: Kuo-Yu Cheng, Tainan (TW); Chih-Ping Chao, Juhdong Township (TW); Kuan-Chi Tsai, Kaohsiung (TW); Shih-Shiung Chen, Tainan (TW); Wei-Kung Tsai, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 41 days.

(21) Appl. No.: 16/662,391

(22) Filed: Oct. 24, 2019

(65) Prior Publication Data
US 2020/0058608 A1 Feb. 20, 2020

Related U.S. Application Data

(60) Continuation of application No. 15/696,532, filed on Sep. 6, 2017, which is a division of application No.
(Continued)

(51) Int. Cl.
*H01L 23/66* (2006.01)
*H01L 23/522* (2006.01)
(Continued)

(52) U.S. Cl.
CPC .......... *H01L 23/66* (2013.01); *H01L 21/6835* (2013.01); *H01L 21/76877* (2013.01);
(Continued)

(58) Field of Classification Search
CPC .......... H01L 21/84–86; H01L 27/1218; H01L 21/563; H01L 29/7812; H01L 29/7824;
(Continued)

(56) References Cited

U.S. PATENT DOCUMENTS 8,076,750 B1  12/2011  Kerr et al.
8,466,036 B2  6/2013  Brindle et al.
(Continued)

FOREIGN PATENT DOCUMENTS

WO  0079556 A1  12/2000
WO  2011159001 A1  11/2011

OTHER PUBLICATIONS

Wijaranakula, et al. "Influence of the preepitaxial annealing and polycrystalline silicon deposition processes on oxygen precipitation and internal gettering in N/N+(100) epitaxial silicon wafers." Journal of Applied Physics 65, 2078. Published in 1989.
(Continued)

*Primary Examiner* — Amar Movva
(74) *Attorney, Agent, or Firm* — Eschweiler & Potashnik, LLC

(57) ABSTRACT

Some embodiments of the present disclosure are directed to a device. The device includes a substrate comprising a silicon layer disposed over an insulating layer. The substrate includes a transistor device region and a radio-frequency (RF) region. An interconnect structure is disposed over the substrate and includes a plurality of metal layers disposed within a dielectric structure. A handle substrate is disposed over an upper surface of the interconnect structure. A trapping layer separates the interconnect structure and the handle substrate.

20 Claims, 10 Drawing Sheets

Related U.S. Application Data

15/051,197, filed on Feb. 23, 2016, now Pat. No. 9,761,546.

(60) Provisional application No. 62/243,442, filed on Oct. 19, 2015.

(51) Int. Cl.

| | | |
|---|---|---|
| *H01L 21/768* | (2006.01) | |
| *H01L 27/12* | (2006.01) | |
| *H01L 21/683* | (2006.01) | |
| *H01L 21/84* | (2006.01) | |
| *H01L 23/48* | (2006.01) | |
| *H01L 23/528* | (2006.01) | |
| *H01L 23/552* | (2006.01) | |

(52) U.S. Cl.
CPC ........ *H01L 21/76898* (2013.01); *H01L 21/84* (2013.01); *H01L 23/481* (2013.01); *H01L 23/528* (2013.01); *H01L 23/5225* (2013.01); *H01L 27/1211* (2013.01); *H01L 27/1214* (2013.01); *H01L 27/1218* (2013.01); *H01L 27/1266* (2013.01); *H01L 23/522* (2013.01); *H01L 23/552* (2013.01); *H01L 2221/68368* (2013.01); *H01L 2224/05025* (2013.01)

(58) Field of Classification Search
CPC ....... H01L 21/76264–76291; H01L 29/30–34; H01L 27/1266; H01L 21/6835; H01L 23/5225; H01L 23/552–556; H01L 21/568; H01L 23/66
See application file for complete search history.

(56) References Cited

U.S. PATENT DOCUMENTS

| | | | |
|---|---|---|---|
| 9,241,247 | B2 | 1/2016 | Ueda et al. |
| 9,455,187 | B1 * | 9/2016 | Gambino ............ H01L 27/1203 |
| 2002/0187619 | A1 | 12/2002 | Kleinhenz et al. |
| 2003/0051660 | A1 | 3/2003 | Koya et al. |
| 2004/0124480 | A1 | 7/2004 | Park et al. |
| 2008/0237736 | A1 | 10/2008 | Sakurai et al. |
| 2010/0156526 | A1 | 6/2010 | Botula et al. |
| 2011/0129984 | A1 | 6/2011 | Funayama et al. |
| 2011/0250739 | A1 | 10/2011 | Falster et al. |
| 2012/0161310 | A1 * | 6/2012 | Brindle ............ H01L 21/02532 |
| | | | 257/734 |
| 2013/0089968 | A1 | 4/2013 | Usenko |
| 2013/0134383 | A1 | 5/2013 | Hwang et al. |
| 2013/0280884 | A1 | 10/2013 | Brindle et al. |
| 2015/0004778 | A1 | 1/2015 | Botula et al. |
| 2015/0179505 | A1 | 6/2015 | Stuber et al. |
| 2015/0287745 | A1 | 10/2015 | Kato |
| 2015/0287783 | A1 | 10/2015 | Arriagada et al. |

OTHER PUBLICATIONS

Saritas, et al. "Deep States Associated with Oxidation Induced Stacking Faults in RTA p-type Silicon Before and After Cooper Diffusion." Solid-State Electronics, vol. 38, No. 5, pp. 1025-1034. Published in 1995.

Ishihara, et al. "Time and Temperature Dependence of Density of Oxidation-Induced Stacking Faults in Diamond-Lapped Silicon." Japanese Journal of Applied Physics, vol. 23, No. 8, pp. L620-L622. Published in Aug. 1984.

Kuper, et al. "Density of Oxidation-Induced Stacking Faults in Damaged Silicon." Journal of Applied Physics, 60 (4). Published on Aug. 15, 1986.

Wolf, et al. "Highly Resistive Substrate Cmos on SOI for Wireless Front-End Switch Applications." CS Mantech Conference, May 16-19, 2011, Palm Springs, California, USA.

Iacona, et al. "Roughness of Thermal Oxide Layers Grown on Ion Implanted Silicon Wafers." Journal of Vacuum Science Technology, B 16(2), Mar./Apr. 1998.

Giri, et al. "Formation and annealing of defects during high-temperature processing of ion-implanted epitaxial silicon: the role of dopant implants." Materials Science and Engineering, B71, 186-191. Published in 2000.

Neve, et al. "RF and linear performance of commercial 200 mm trap-rich HRSOI wafers for SoC applications." IEEE, SiRF. Published in 2013.

Lederer, et al. "Substrate loss mechanisms for microstrip and CPW transmission lines on lossy silicon wafers." IEEE MTT-S International Microwave Symposium Digest. IEEE MTT-S International Microwave Symposium, Nov. 2003.

Neve, et al. "Impact of Si substrate resistivity on the non-linear behaviour of RF CPW transmission lines." Proceedings of the 3rd European Microwave Integrated Circuits Conference, Oct. 2008.

U.S. Appl. No. 14/222,785, filed Mar. 24, 2014.

Non-Final Office Action dated May 22, 2015 for U.S. Appl. No. 14/222,785.

Notice of Allowance dated Oct. 13, 2015 U.S. Appl. No. 14/222,785.

U.S. Appl. No. 14/068,353, filed Oct. 31, 2013.

U.S. Appl. No. 14/161,208, filed Jan. 22, 2014.

Non Final Office Action dated Jul. 5, 2016 U.S. Appl. No. 14/840,155.

Final Office Action dated Dec. 21, 2016 U.S. Appl. No. 14/840,155.

Notice of Allowance dated Mar. 10, 2017 U.S. Appl. No. 14/840,155.

Notice of Allowance dated Apr. 26, 2017 U.S. Appl. No. 15/051,197.

Non-Final Office Action dated May 15, 2019 for U.S. Appl. No. 15/696,532.

Final Office Action dated Nov. 21, 2019 for U.S. Appl. No. 15/696,532.

* cited by examiner

TRAP LAYER SUBSTRATE STACKING TECHNIQUE TO IMPROVE PERFORMANCE FOR RF DEVICES

REFERENCE TO RELATED APPLICATIONS

This Application is a Continuation of U.S. application Ser. No. 15/696,532, filed on Sep. 6, 2017, which is a Divisional of U.S. application Ser. No. 15/051,197, filed on Feb. 23, 2016 (now U.S. Pat. No. 9,761,546, issued on Sep. 12, 2017), which claims the benefit of U.S. Provisional Application No. 62/243,442, filed on Oct. 19, 2015. The contents of the above-referenced Patent Applications are hereby incorporated by reference in their entirety.

BACKGROUND

Integrated circuits are formed on semiconductor substrates and are packaged to form so-called chips or microchips. Traditionally, integrated circuits are formed on bulk semiconductor substrates comprising semiconductor material, such as silicon. In more recent years, semiconductor-on-insulator (SOI) substrates have emerged as an alternative. SOI substrates have a thin layer of active semiconductor (e.g., silicon) separated from an underlying handle substrate by a layer of insulating material. The layer of insulating material electrically isolates the thin layer of active semiconductor from the handle substrate, thereby reducing current leakage of devices formed within the thin layer of active semiconductor. The thin layer of active semiconductor also provides for other advantages, such as faster switching times and lower operating voltages, which have made SOI substrates widely used for high volume fabrication of radio frequency (RF) systems, such as RF switches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
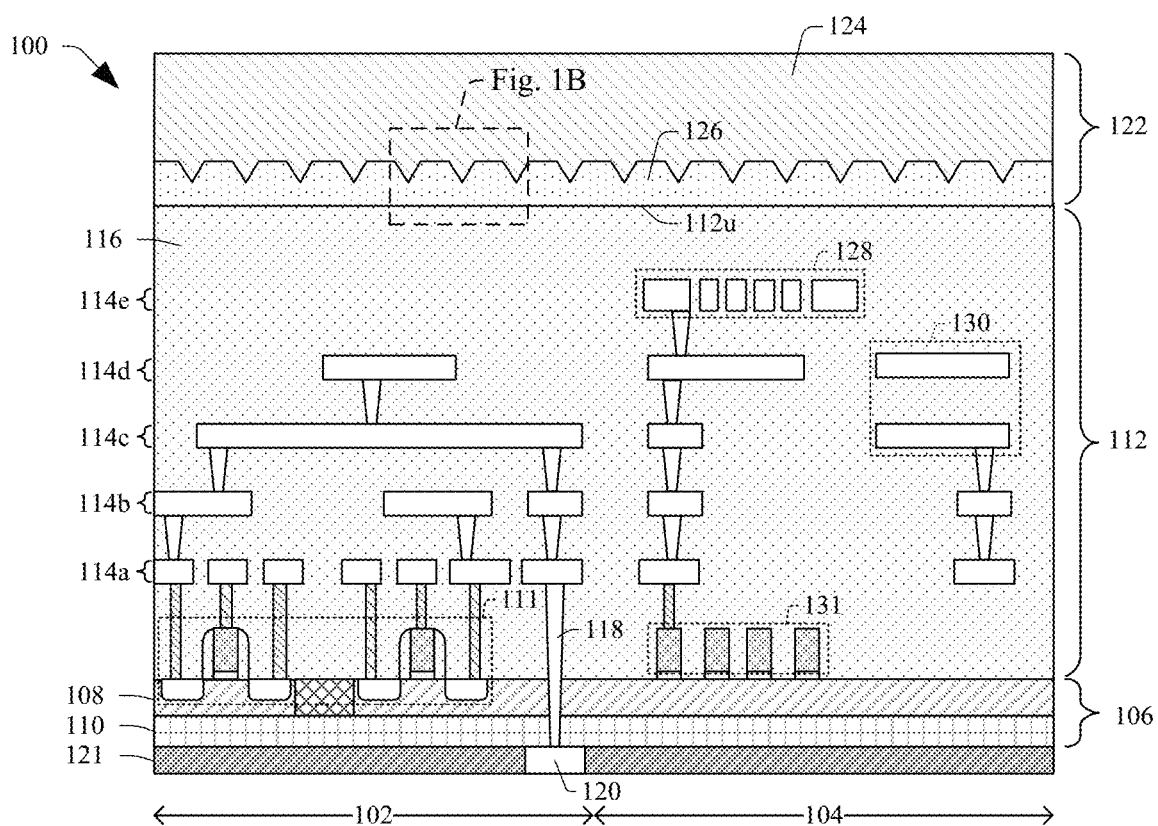
FIG. 1A illustrates a cross-sectional view of some embodiments of a device according to some aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

RF semiconductor devices, which are typically manufactured on semiconductor-on-insulator (SOI) substrates, operate at high frequencies and generate RF signals. For these RF devices, the SOI substrates typically include a high-resistance handle substrate, an insulating layer over the handle substrate, and a semiconductor layer disposed over the insulating layer. The high-resistance handle substrate has a low-doping concentration and can exhibit a resistance ranging from 2 kilo-ohms-centimeter (kΩ-cm) to 8 kΩ-cm, for example. The high resistance of the handle substrate may improve radio frequency (RF) performance of the RF devices in some regards, but an appreciation in the present disclosure lies in the fact that the high resistance handle substrate may still be a source of Eddy currents when carriers are freed from the lattice of the high-resistance handle substrate by the RF signals. These Eddy currents, which can exhibit high frequencies, are a source of noise in the final chip. In particular, these Eddy currents can lead to device cross-talk and/or non-linear signal distortion.

To prevent such cross-talk and non-linear signal distortion, the present disclosure proposes to manufacture the RF devices on an SOI substrate, which includes a handle substrate, a layer of insulating material, and an active semiconductor layer. However, rather than leaving the handle substrate present in the final device, the manufacturing process removes the handle substrate from the underside of the insulating layer prior to final packaging of the device, such that the handle substrate is no longer present to act as a source of Eddy currents.

With reference to FIG. 1A, a cross-sectional view of some embodiments of a device 100 according to the present disclosure is provided. The device 100 includes a first substrate 106, an interconnect structure 112 disposed over the first substrate 106, and a second substrate 122 disposed over the interconnect structure 112. The first substrate 106 includes an insulating layer 110 and an active semiconductor layer 108; and the interconnect structure 112 includes a plurality of metal layers (e.g., 114a-114e) disposed within a dielectric structure 116. One or more active components such as metal oxide semiconductor field effect transistors (MOSFETs) 111 are disposed in or over a transistor region 102 of the first substrate 106, and one or more passive components such as inductor 128, capacitor 130, and/or resistor 131 are disposed over an RF region 104 of the first substrate 106. A through-substrate-via (TSV) 118 extends vertically through the semiconductor layer 108 and through the insulating layer 110. The TSV 118 electrically couples a metal layer (e.g., 114*a*, 114*b*, 114*c*, . . . ) to a contact pad 120 on a lower surface of the insulating layer 110. A surface of the contact pad 120 can remain exposed through a packaging or molding layer 121, thereby allowing the device 100 to be mounted to a circuit board or another chip via solder bumps, wire bonds, etc., such that the circuit board or other chip can be electrically coupled to active and/or passive components on the device 100.

Notably, the first substrate 106 exhibits an absence of a handle substrate under the insulating layer 110, and thus the contact pad 120 is in direct contact with the lower surface of the insulating layer 110 in some embodiments. As will be appreciated in more detail below, for example with regards to FIGS. 2-13, the device 100 can be manufactured by a process in which the first substrate 106 is initially an SOI wafer which includes semiconductor layer 108, insulating layer 110, and a handle substrate under the insulating layer 110. However, in the final device such as shown in FIG. 1A, the underlying handle substrate has been removed to prevent the underlying handle substrate from acting as an Eddy current source during device operation. Because the insulating layer 110 is insulating (and thus not susceptible to Eddy currents), removal of the underlying handle substrate removes a source of problematic Eddy currents from the bottom of first substrate 106. Thus, the device 100 can exhibit less cross-talk and less distortion than conventional devices.

To offset the diminished thickness and structural rigidity of the first substrate 106 due to the removal of the underlying handle substrate, and to provide for sufficient thickness to adequately fill out a package and to provide for structural support during manufacture, a handle substrate 124 is disposed over an upper surface 112*u* of the interconnect structure 112. An optional but advantageous trapping layer 126 can separate the interconnect structure 112 from the handle substrate 124. The trapping layer 126 is configured to trap carriers excited by RF components (e.g., inductor 128 and/or capacitor 130) to limit Eddy currents in the handle substrate 124. For example, consider a case where, when a suitable bias is applied, the inductor 128 and/or capacitor 130 individually or collectively generate an RF signal, which can excite carriers in the handle substrate 124 to some extent. The trapping layer 126 is configured to trap these carriers to limit corresponding Eddy currents. The trapping layer 126 can manifest as doped or un-doped polysilicon in some embodiments, or can manifest as an amorphous silicon layer. The trapping layer 126 can meet the handle substrate 124 at an interface surface that exhibits peaks and valleys in some cases, is substantially planar in other cases, or is generally roughened in other cases.

Figure 1B:
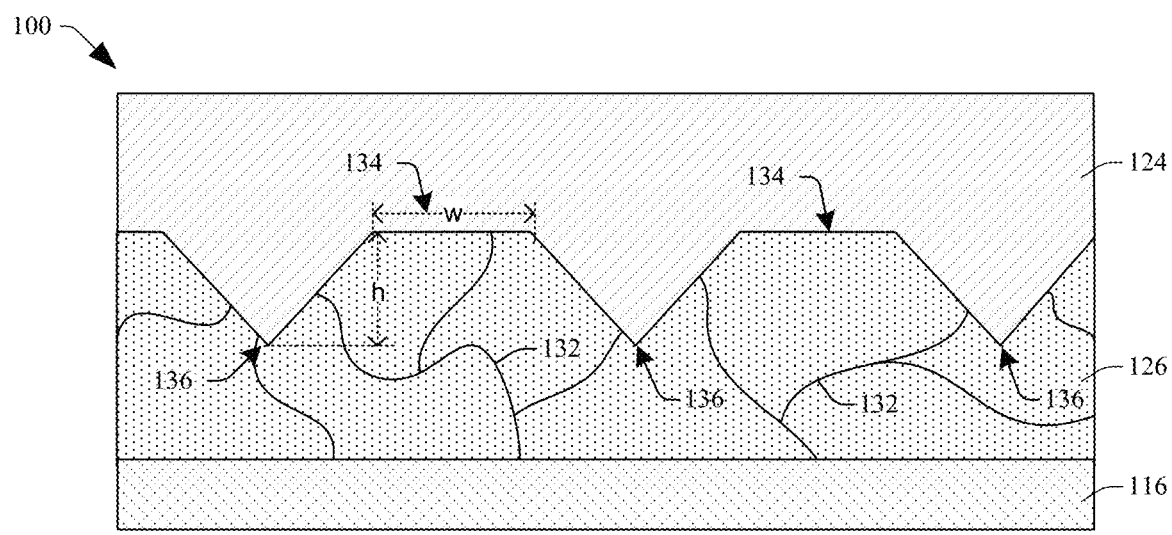
FIG. 1B illustrates an enlarged cross-sectional view of a portion of FIG. 1A in accordance with some embodiments.

FIG. 1B shows some embodiments where the trapping layer 126 is made of polysilicon and has a plurality of grain boundaries 132. The grain boundaries 132 are dislocations or defects where the atoms of the trapping layer 126 are out of position or misaligned within the crystal lattice. The grain boundaries 132 act as recombination centers that are configured to trap carriers (e.g., carriers from within the handle substrate 124). Once trapped within the recombination centers, the lifetime of the carriers is decreased. Therefore, by trapping carriers within the grain boundaries 132 of the trapping layer 126, the build-up of carriers along a lower surface of the handle substrate 124 is reduced substantially, which mitigates Eddy currents, cross talk, and non-linear distortion during operation of device 100.

In some embodiments, an interface between the handle substrate 124 and the trapping layer 126 comprises a series of peaks 134 and valleys 136, which may establish a saw-toothed profile. The peaks 134 and valleys 136 facilitate smaller grain sizes, and therefore facilitate more grain boundaries near the top surface of handle substrate 124. Thus, most of the carriers are trapped at the grain boundaries 132 to mitigate and/or prevent Eddy currents. The peaks 134 and/or valleys 136 can be triangular-shaped, pyramid-shaped, or cone-shaped, among others. In some embodiments, the peaks 134 can have a height, h, ranging from approximately 10 nm to approximately 1 um as measured from the base of a neighboring valley (or a more distant valley), and being approximately 0.5 um in some embodiments. The peaks 134 can also have a width, w, ranging from approximately 10 nm to approximately 10 um, and being approximately 1 um in some embodiments. In other embodiments, rather than being flat-topped as illustrated, the peaks 134 may come to a point and/or may be rounded. Similarly, rather than coming to a point as illustrated, the valleys 136 can be flat-bottomed or rounded in other embodiments. In some embodiments, neighboring peaks may have the same heights and/or widths as one another (neighboring valleys may also have the same depths and/or widths as one another), but peaks can also have different heights and/or different widths from one another (and valleys can have different depths and/or widths) in other embodiments. In some cases, the peaks and/or valleys follow a random distribution of heights and/or widths, follow a Gaussian distribution of heights and/or widths, or follow some other distribution.

The inclusion of the handle substrate 124 over the interconnect structure 112 may provide increased structural rigidity to offset the lack of a handle substrate under the insulating layer 110. In addition, the trapping layer 126 may reduce Eddy currents as a potential source of noise in the handle substrate 124, and although optional, is advantageous for many applications.

With reference to FIGS. 2-13, a series of cross-sectional views collectively depict a method of manufacturing a device in accordance with some embodiments.

Figure 2:
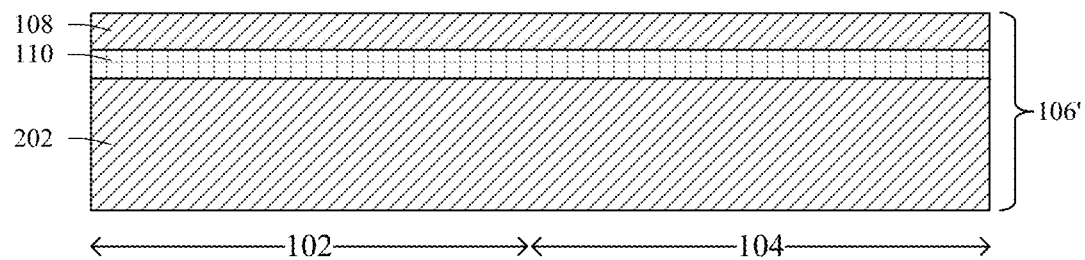
FIGS. 2-13 illustrate some embodiments of cross-sectional views showing a method of forming an IC at various stages of manufacture.

FIG. 2 illustrates a cross-sectional view of some embodiments of a providing an SOI substrate 106'. As illustrated by FIG. 2, the SOI substrate 106' is a semiconductor-on-insulator (SOI) substrate, which includes a handle substrate 202, an insulating layer 110 disposed over the handle substrate 202, and a semiconductor layer 108 disposed over the insulating layer 110. In many instances, the SOI substrate 106' can take the form of a disc-like wafer. Such a wafer can have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); or 450 mm (17.7 inch, usually referred to as "18 inch"); for example.

The handle substrate 202 can have a thickness that is sufficient to provide the SOI substrate 106' with sufficient structural rigidity to withstand semiconductor processing operations. For example, in some embodiments the handle substrate 202 has a thickness ranging from approximately 200 μm to approximately 1000 μm, being approximately 700 μm in some embodiments. In exemplary embodiments, the handle substrate 202 can be a low resistivity silicon handle substrate, having a resistance of ranging between several ohm-cm and several tens of ohm-cm, and ranging between 8 ohm-cm and 12 ohm-cm in some embodiments. In alternative embodiments, the handle substrate 202 can be a high-resistance silicon handle substrate, having a resistance between several hundreds and several thousands of ohms-cm, and ranging between from 2 kΩ-cm to 8 kΩ-cm in some embodiments. Although either a high-resistance or low-resistance silicon substrate can be used, it is advantageous to use low-resistance silicon substrates because low-resistance silicon substrates are cheaper, and since the handle substrate 202 will be removed in this manufacturing process, their greater resistivity does not provide significant advantages. Other handle substrates, such as sapphire substrates, can also be used.

In some embodiments, the insulating layer 110 can have a thickness ranging from less than a micron to several microns, which is sufficient to provide electrical isolation between the handle substrate 202 and the semiconductor layer 108. In some embodiments, the insulating layer 110 can be silicon dioxide, which has a dielectric constant of approximately 3.9. In other embodiments, the insulating layer 110 can be a low-κ dielectric material. Non-limiting examples of low-κ dielectric material include, but are not limited to: fluorine doped silicon dioxide, carbon-doped silicon dioxide, porous silicon dioxide, porous carbon-doped silicon dioxide, spin-on organic polymeric dielectrics, and/or spin-on silicon based polymeric dielectric.

In some embodiments, the semiconductor layer 108 is a layer of pure silicon, which can be exhibit a monocrystalline lattice structure and which can be intrinsic (e.g., undoped) or doped p-type or n-type. The semiconductor layer 108 can have a thickness ranging from several microns down to approximately one nanometer in some embodiments. The semiconductor layer 108 can also be a semiconductor compound made of elements from two or more different groups from the periodic table. The elements can form binary alloys (two elements, e.g., GaAs), ternary alloys (three elements, e.g., InGaAs or AlGaAs), or quaternary alloys (four elements, e.g., AlInGaP). The semiconductor layer 108 can include doped regions, epitaxial layers, insulating layers formed in or on the semiconductor layer, photoresist layers formed in or on the semiconductor layer, and/or conducting layers formed in or on the semiconductor layer.

Figure 3:
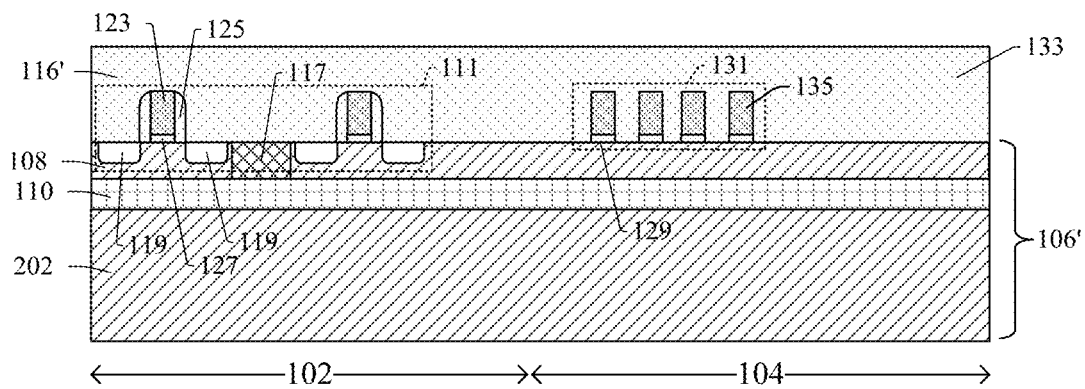

In FIG. 3, active components, such as MOSFETS 111 and/or other field-effect transistors (FETs) are formed in or over a transistor region 102 of the semiconductor layer 108. A shallow trench isolation (STI) region 117 is formed, in which insulating material surrounds an island of the material of semiconductor layer 108. A gate electrode 123 is formed, sidewall spacers 125 are formed on opposing sidewalls of the gate electrode 123, and source/drain regions 119 are formed on opposite sides of the sidewall spacers 125. A gate dielectric 127 separates the gate electrode 123 from a channel region in the semiconductor layer separating the source/drain regions 119. In some embodiments, the gate electrode 123 comprises polysilicon or metal, the sidewall spacers 125 comprise silicon nitride, and the gate dielectric 127 comprises silicon dioxide or a high-K dielectric. Although not illustrated, the transistors 111 can also take other forms, such as finFET devices, bipolar junction transistors, floating gate transistors, etc. A resistor 131, which can be made of polysilicon 135 for example and can be isolated from the semiconductor layer 108 by gate dielectric and/or another dielectric 129, can be formed in the RF region 104. A dielectric layer 133 extends over upper surfaces of the gate electrodes 123 and source/drain regions 119. The dielectric layer 133 may comprise a low-κ dielectric material or silicon dioxide.

Figure 4:
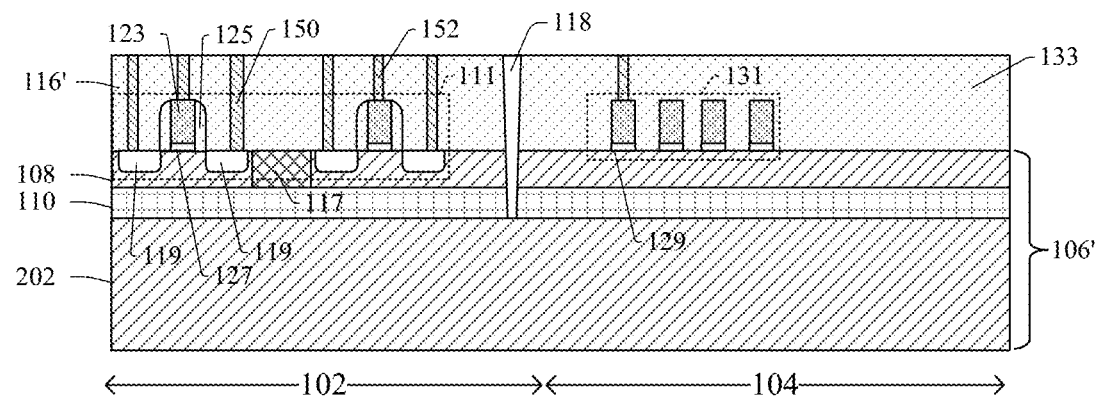

In FIG. 4, source/drain contacts 150 are formed to provide an ohmic connection to the source/drain regions 119 through the dielectric layer 133, and gate contacts 152 are formed to provide an ohmic connection to top surfaces of the gate electrodes 123. In some embodiments, the source/drain contacts 150 and/or gate contacts 152 may comprise, for example, copper, tungsten, aluminum, gold, titanium or titanium nitride. In addition, a through-substrate-via (TSV) 118 is formed. The illustrated TSV 118 extends downwardly through the dielectric layer 133, through the semiconductor layer 108, and through the insulating layer 110. In other embodiments, the TSV 118 can extend downward partially or fully through the handle substrate 202 as well. The TSV 118 can be made of for example, copper, tungsten, aluminum, gold, titanium or titanium nitride, and can be made of the same or different material than the source/drain contacts 150 and/or gate contacts 152. The TSV 118 is typically formed by a separate photomask and/or etch than the source/drain contacts and/or gate contacts.

Figure 5:
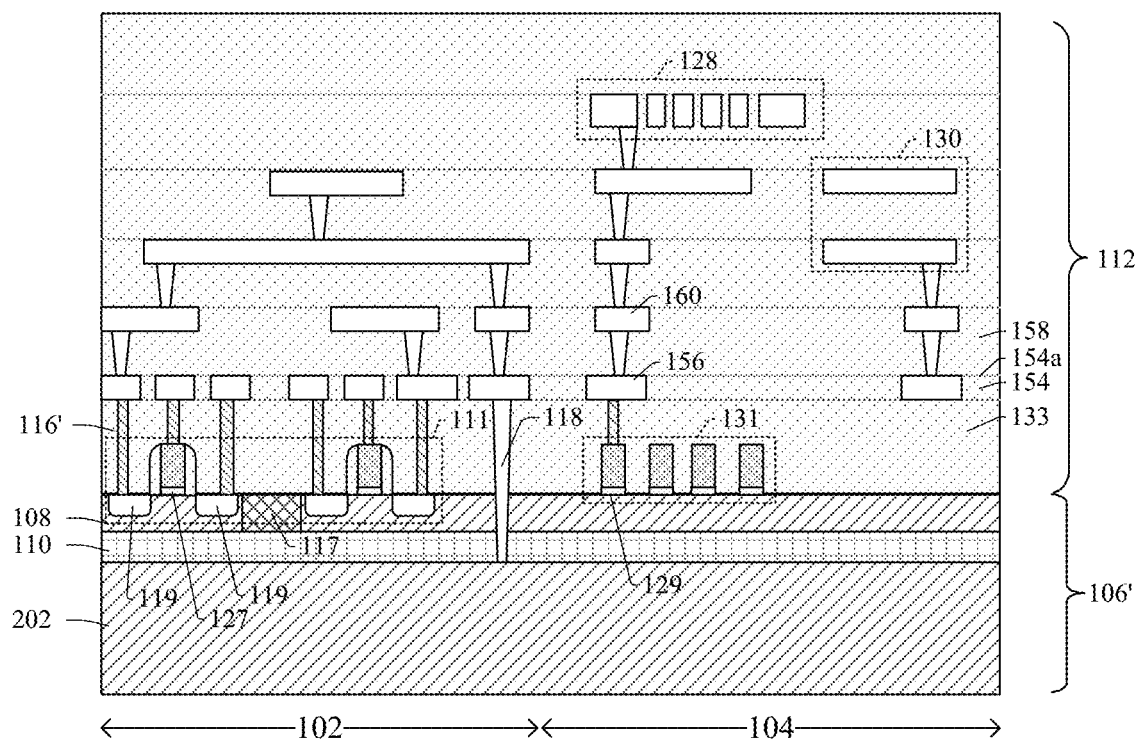

As illustrated by FIG. 5, an interconnect structure 112 is formed over the SOI substrate 106'. The interconnect structure 112 is formed by forming a first dielectric layer 154, such as a low-κ dielectric layer, nitride, or silicon dioxide dielectric layer, and then forming one or more photoresist masks over the first dielectric layer 154. With a photoresist mask in place, an etch is carried out to form trench openings and/or via openings in the first dielectric layer 154. Metal is then deposited to fill the openings in the first dielectric layer 154, thereby forming vias and/or metal lines 156 corresponding to a metal 1 layer. In some embodiments, copper is used to fill the openings in the first dielectric layer 154, such that vias and metal 1 lines are made of copper. In embodiments where copper is used, typically the openings are lined with a diffusion barrier layer, then a copper seed layer is formed over the diffusion barrier layer, and an electroplating process is used build up copper to fill the openings. The diffusion barrier layer typically has a high electrical conductivity in order to maintain a good electronic contact, while maintaining a low enough copper diffusivity to sufficiently chemically isolate these copper conductor films from underlying structures. Cobalt, ruthenium, tantalum, tantalum nitride, indium oxide, tungsten nitride, and titanium nitride are some non-limiting examples of materials that can be used for the diffusion barrier layer. After the metal is grown to fill the openings, a chemical mechanical planarization (CMP) operation is carried out to planarize the first metal layer and first dielectric at plane 154a. A second dielectric layer 158 is then formed, openings are formed in the second dielectric layer 158, and metal is deposited to form vias and metal 2 lines 160. Additional dielectric and metal layers are formed in this manner until the interconnect structure 112 is formed. As illustrated in FIG. 5, the interconnect structure 112 can include an RF component such as inductor 128 and/or capacitor 130, and which is formed over an RF region 104 of the SOI substrate 106'.

Figure 6:
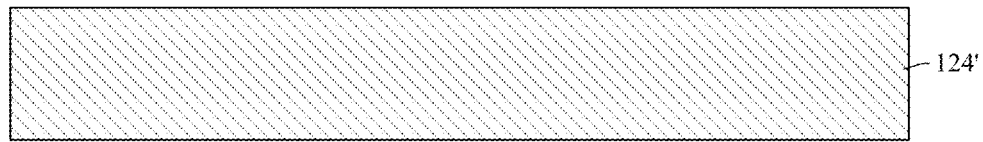

In FIG. 6, a second handle substrate 124' such as a bulk silicon wafer is provided. The second handle substrate 124' can have a thickness ranging between 300 μm and 1000 μm, being approximately 700 μm in some embodiments. In some embodiments, the second handle substrate 124' can have a resistivity that is greater than that of the handle substrate 202. For example, in some embodiments, the second handle substrate 124' can have a resistivity ranging between several hundreds and several thousands of ohms-cm, and ranging between from 2 kΩ-cm to 8 kΩ-cm in some embodiments, which can help reduce Eddy currents in the final device. In some cases, the second handle substrate 124' is provided for structural support, and thus can exhibit an absence of device features and an absence of interconnect features in some embodiments. In many instances, the second handle substrate 124' can take the form of a disc-like wafer. Such a wafer can have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); or 450 mm (17.7 inch, usually referred to as "18 inch"); for example; and often has the same diameter as the SOI substrate 106'.

Figure 7:
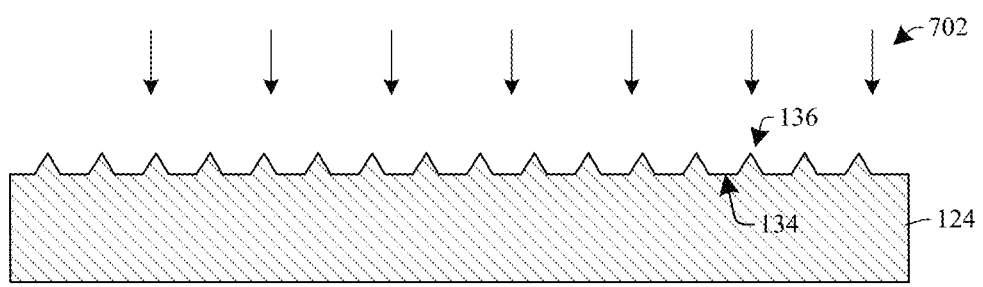

In FIG. 7, a top surface of the second handle substrate 124' is etched to form peaks 134 and valleys 136. The peaks 134 and valleys 136 are created by first using a photo mask (not shown) to define a pattern on the top surface, and then exposing the top surface to an etchant 702, to make the top surface rough with peaks and valleys. In other embodiments, the second handle substrate 124' may be damaged by mechanically damaging the top surface of the second handle substrate 124' (e.g., micro-scratching, abrasive blasting, etc.), or by performing sputtering, a deposition, or self-assembled monolayer. In some embodiments, the peaks and valleys comprise saw-toothed shaped protrusions and corresponding indentations, wherein peaks and valleys of the individual "teeth" are spaced at regular intervals or random intervals. In other embodiments, the peaks and valleys comprise random shaped protrusions having different lattice directions and geometries. In some embodiments, the etchant 702 may comprise a dry etchant (e.g., a plasma etchant, an RIE etchant, etc.) or a wet etchant (e.g., hydrofluoric acid).

Figure 8:
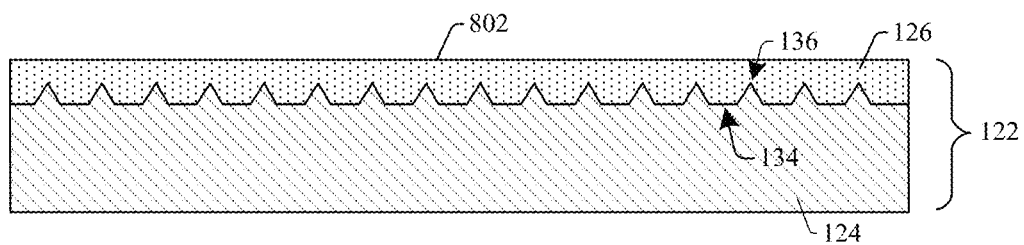

In FIG. 8, a trapping layer 126 is formed over the peaks 134 and valleys 136, such that an interface is established between the trapping layer 126 and the second handle substrate 124'. Thus, a second substrate 122 is provided. In some embodiments, the trapping layer 126 can be a polycrystalline silicon layer. In other embodiments, the trapping layer 126 may comprise amorphous silicon that includes a dopant species. In various embodiments, the dopant species may comprise argon (Ar), carbon (C), and/or germanium (Ge). The surface 802 of the trapping layer which is furthest from the second handle substrate 124' may be planarized in some cases, by using CMP for example, to make it more suitable for bonding.

Figure 9:
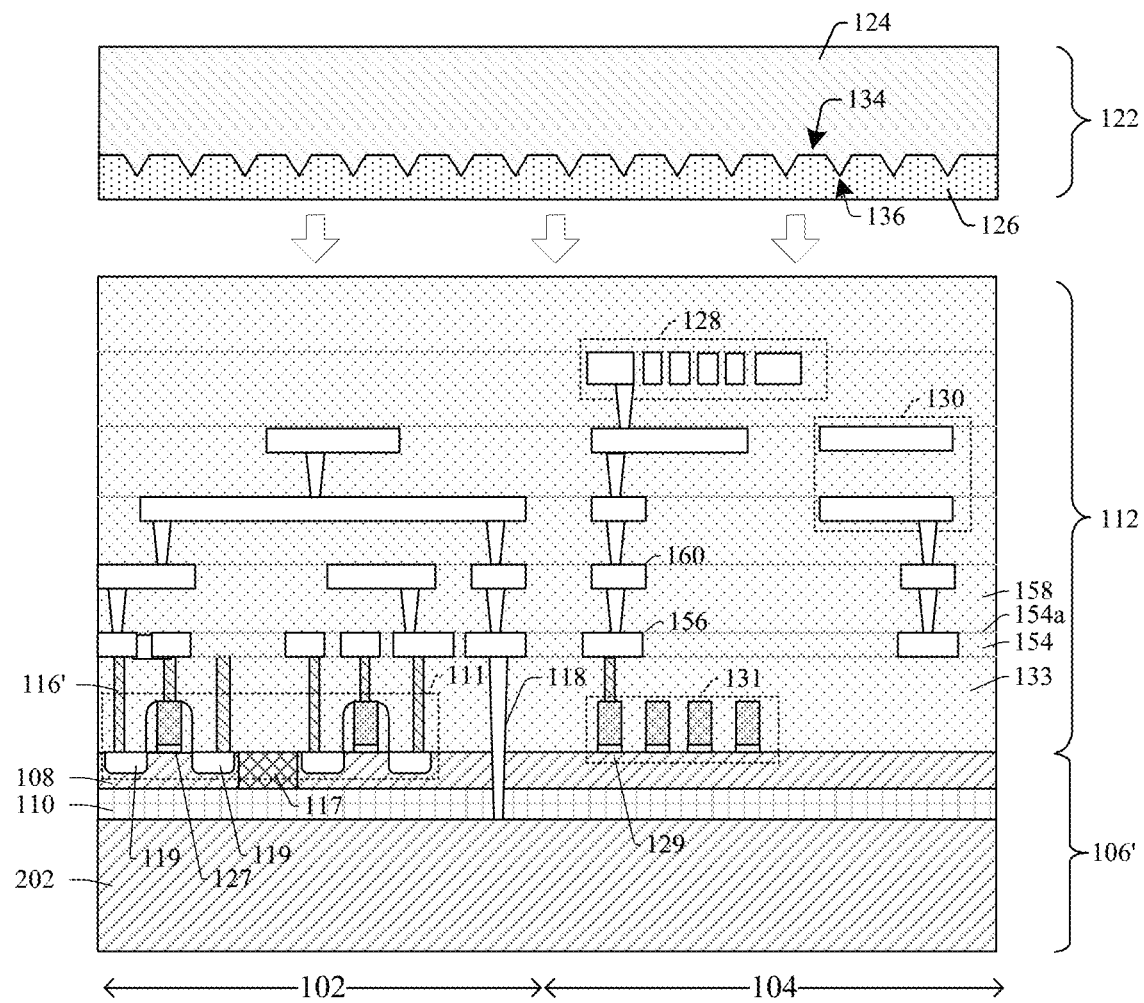

In FIG. 9, the SOI substrate 106' and interconnect structure 112 are bonded to the second substrate 122. This bonding can take one of many forms, such as fusion bonding, or bonding through epoxy. In some embodiments, an oxide can be formed over the lower surface of trapping layer 126 prior to bonding, and the oxide on the lower surface of trapping layer 126 can then be bonded to the upper surface of interconnect structure 112 by carrying out an annealing process.

Figure 10:
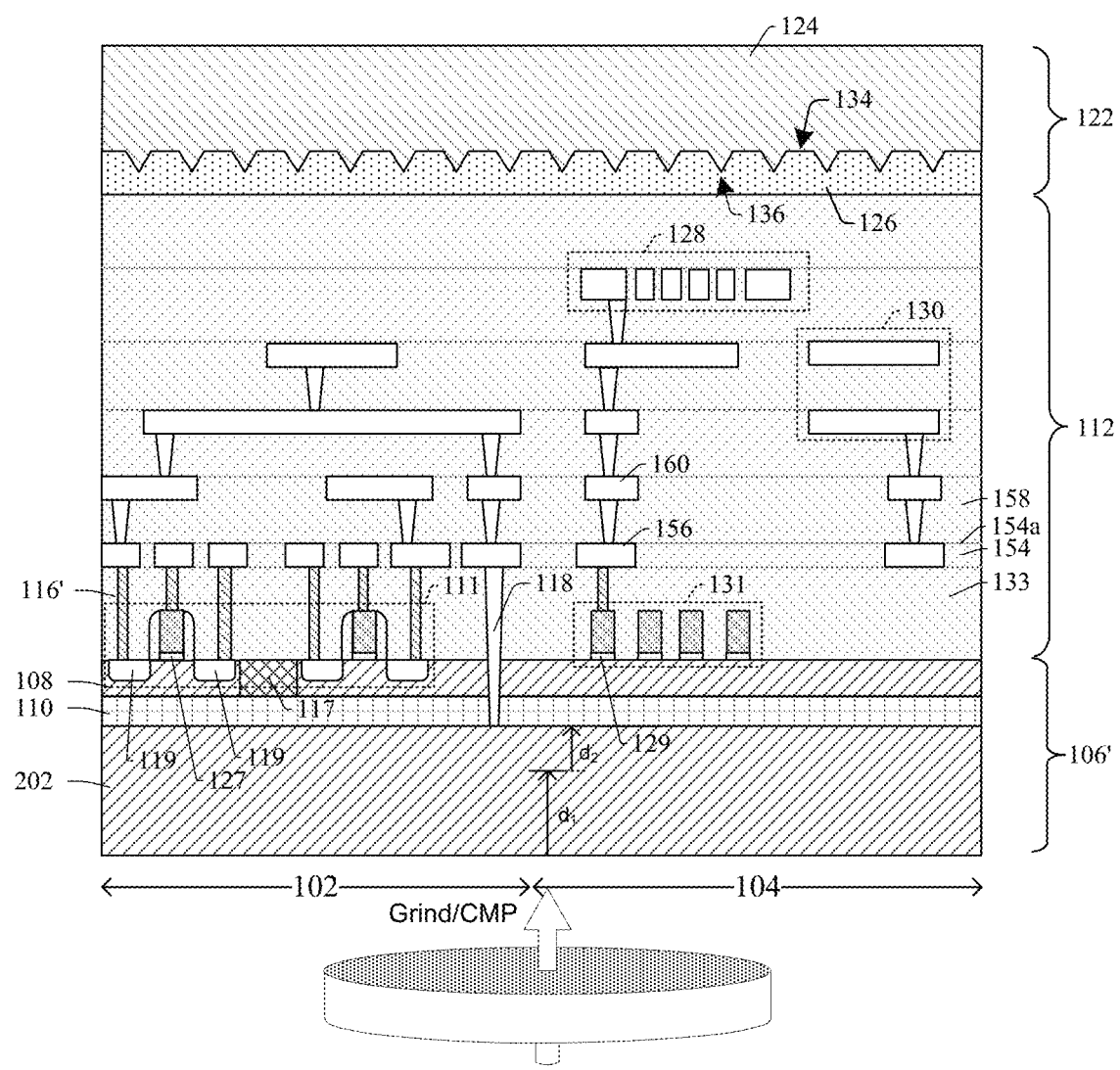

In FIG. 10, the handle substrate 202 is removed. In some embodiments, a two-stage process is used to remove the handle substrate 202. During a first stage, a grinding process is used to thin-down the handle substrate, for example by a first distance d1. The grinding process can use a surface that is fairly abrasive and thus grinds down through the distance d1 of the handle substrate 202 fairly quickly. After the grinding process is complete, as determined for example by a predetermined time or by performing measurements indicating the predetermined distance d1 has been removed; a chemical mechanical planarization (CMP) operation is carried out to remove a second, remaining amount d2 of the handle substrate 202. The CMP operation typically uses a polishing pad that is less abrasive then grinding, thereby providing a smoother, more uniform surface then grinding. The CMP operation can end, for example, after a predetermined time has elapsed, or when measurements indicate the handle substrate 202 has been fully removed. It will be appreciated that in some embodiments, some amount of thinned handle substrate 202 may be left on the bottom surface of the insulating layer 110.

Figure 11:
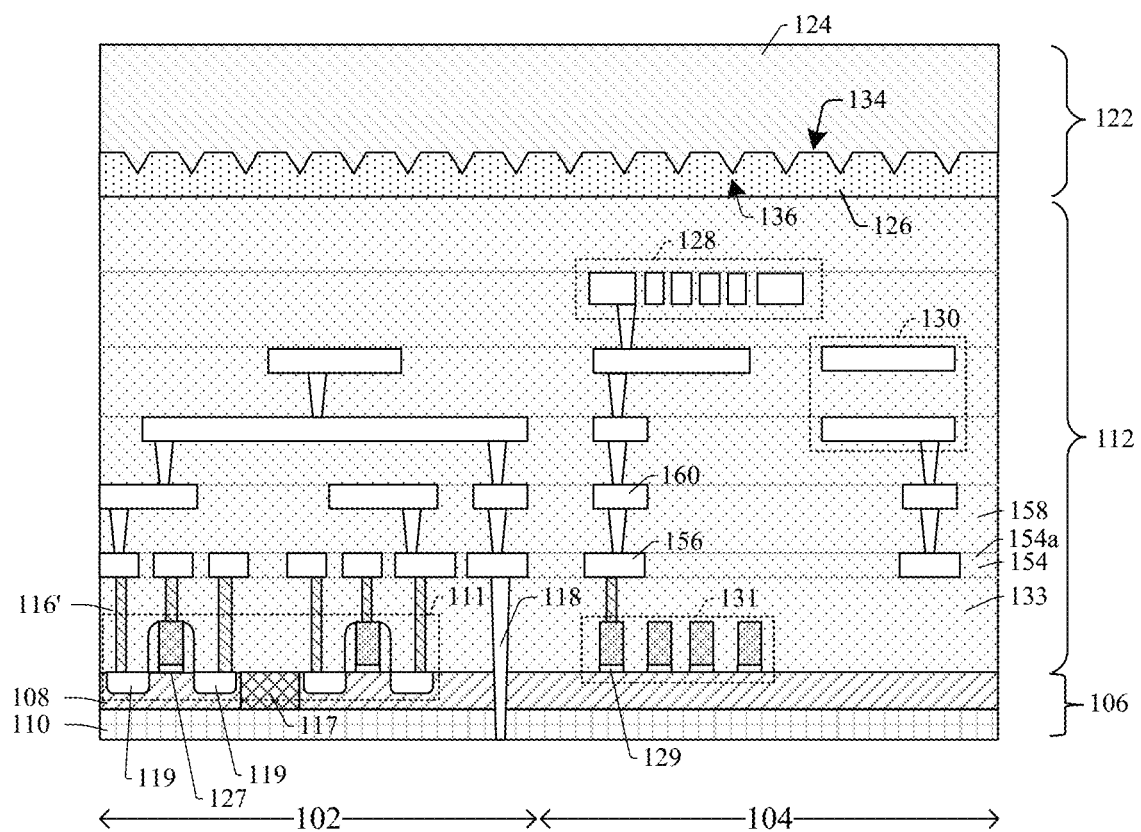

FIG. 11 shows the structure of FIG. 10 after CMP has been carried out. In FIG. 11's example, the lower portion of TSV 118 is exposed.

Figure 12:
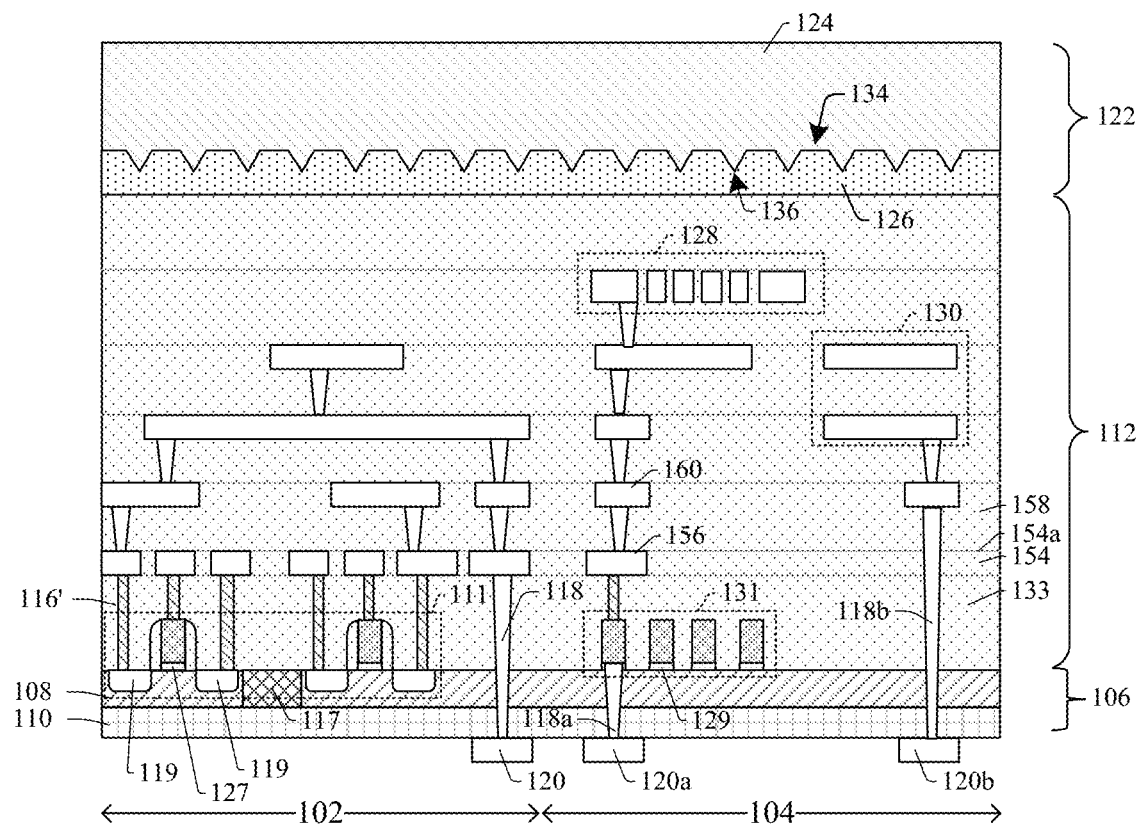
Figure 13:
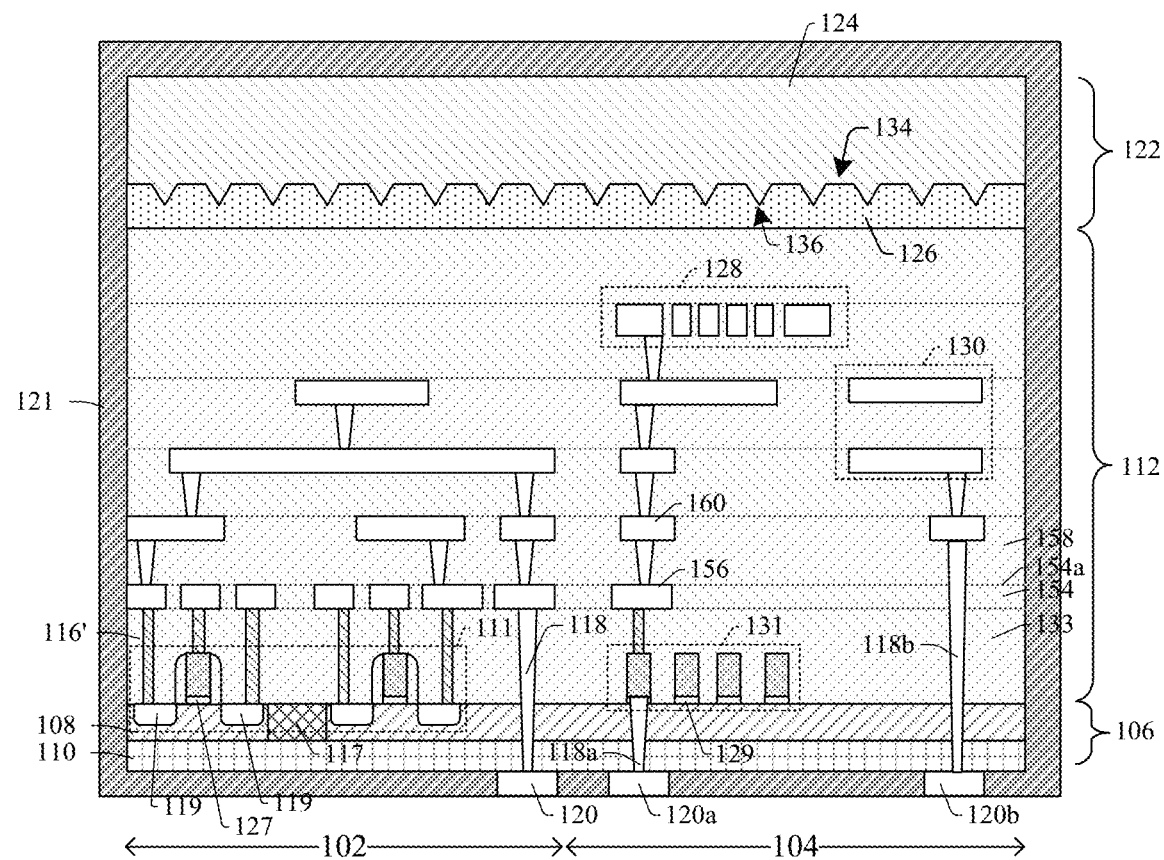

In FIG. 12, a contact pad 120 has been formed in direct contact with lower portion of the TSV 118. The contact pad 120 is in direct contact with underside of insulating layer 110 in some embodiments. The contact pad 120 can be made of, for example, copper, tungsten, aluminum, gold, titanium or titanium nitride. In some embodiments, the contact pad 120 is made by forming a metal layer on the bottom surface of the insulating layer 110, and then patterning the metal layer, for example using a photolithographic mask and performing etching of the metal layer with the photolithographic mask in place. Note that FIG. 12 shows several different TSVs 118, 118a, 118b and corresponding contact pads 120, 120a, 120b, respectively, to highlight some examples. TSV 118 extends between metal 1 layer, dielectric layer 133, semiconductor layer 108, and insulating layer 110; while the second TSV 118a extends from a lower surface of resistor 131 through dielectric 129, semiconductor layer 108, and insulating layer 110. A third TSV 118b extends from metal 2 line through second dielectric layer 158, first dielectric layer 154, dielectric layer 133, through semiconductor layer 108, and through insulating layer 110.

After formation of the contact pads 120, the structure, which is often still in the shape of a disc-like wafer, can optionally be bonded to other substrates to establish a 3D IC, and can be cut or scribed into individual dies or integrated circuits. Then, in FIG. 13, a packaging layer 121 is formed to cover a lower surface of the insulating layer 110. The packaging layer 121 can extend along sidewalls of the device to cover an upper surface of the second handle substrate 122. The packaging layer 121 can be made of ceramic or a polymer material, for example, and can protect the device from environment extremes, corrosiveness, dirt, dust, water vapor, etc.

Figure 14:
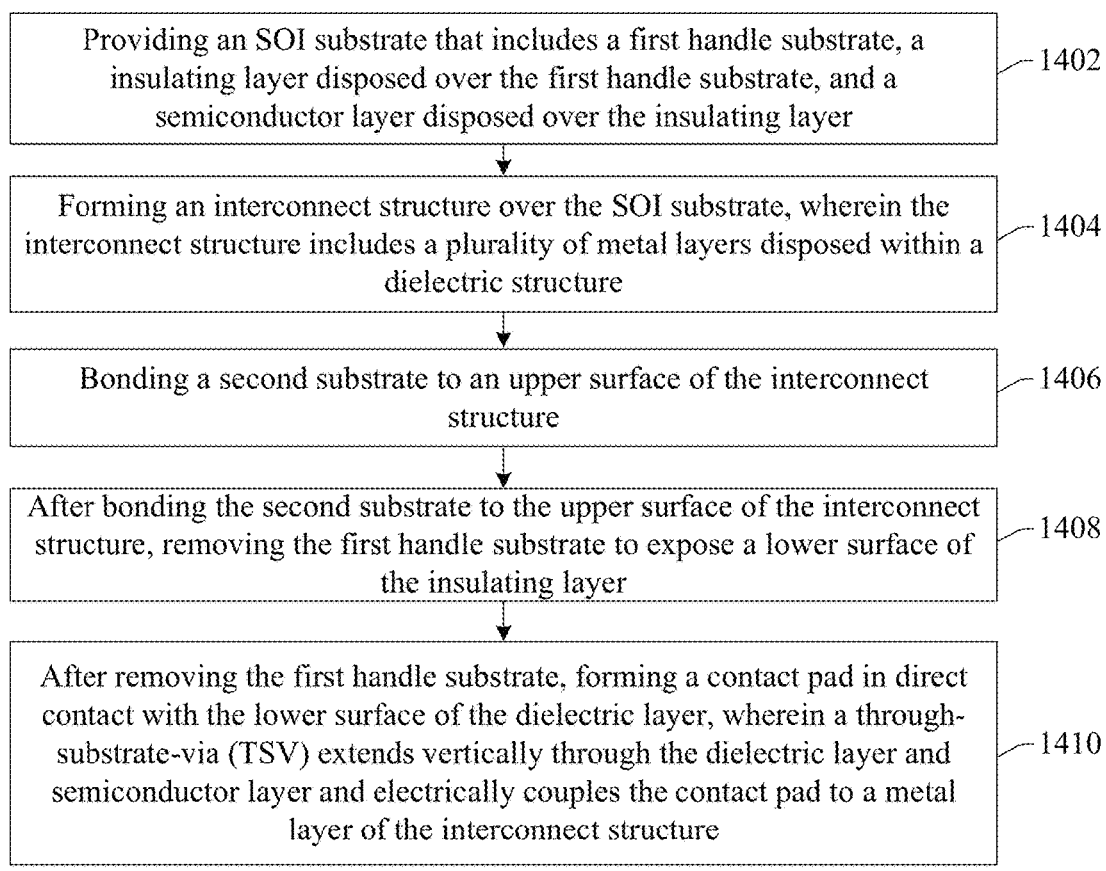
FIG. 14 illustrates a flow diagram of some embodiments of a method of forming a device in accordance with some embodiments.

FIG. 14 illustrates a flow diagram of some embodiments of a method 1400 for manufacturing a device according to some aspects of this disclosure. While the disclosed method 1400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases. Further, although FIG. 14 is described in relation to FIGS. 2-13 for clarity, it will be appreciated that the structures disclosed in FIGS. 2-13 are not limited to the method of FIG. 14, but instead may stand alone as structures independent of the method. Similarly, although the method of FIG. 14 is described in relation to FIGS. 2-13, it will be appreciated that the method is not limited to the structures disclosed in FIGS. 2-13, but instead may stand alone independent of the structures disclosed in FIGS. 2-13.

At 1402, an SOI substrate is provided. The first substrate includes a first handle substrate, an insulating layer disposed over the first handle substrate, and a semiconductor layer disposed over the insulating layer. Thus, 1402 can correspond to FIG. 2, for example.

At 1404, an interconnect structure is formed over the SOI substrate. The interconnect structure includes a plurality of metal layers disposed within a dielectric structure. Thus, 1404 can correspond to FIG. 5, for example.

At 1406, a second substrate is bonded to an upper surface of the interconnect structure. In some embodiments, the second substrate includes a second handle substrate and a trapping layer. In some such embodiments, after bonding, the trapping layer is disposed between the second handle substrate and the upper surface of the interconnect structure. Thus, 1406 can correspond to FIG. 9, for example.

At 1408, after the second substrate has been bonded to the upper surface of the interconnect structure, the first handle substrate is removed to expose a lower surface of the insulating layer. Thus, 1408 can correspond to FIG. 10, for example.

At 1410, after the first handle substrate has been removed, a contact pad is formed in direct contact with the lower surface of the insulating layer. A through-substrate-via (TSV) extends vertically through the insulating layer and semiconductor layer and electrically couples the contact pad to a metal layer of the interconnect structure. Thus, 1410 can correspond to FIG. 12, for example.

Thus, as can be appreciated from above, some embodiments of the present disclosure are directed to a device. The device includes a substrate comprising a silicon layer disposed over an insulating layer. The substrate includes a transistor device region and a radio-frequency (RF) region. An interconnect structure is disposed over the substrate and includes a plurality of metal layers disposed within a dielectric structure. A handle substrate is disposed over an upper surface of the interconnect structure. A trapping layer separates the interconnect structure and the handle substrate.

Other embodiments relate to a method. In the method, a first substrate is provided. The first substrate includes a first handle substrate, an insulating layer disposed over the first handle substrate, and a semiconductor layer disposed over the insulating layer. An interconnect structure is formed over the substrate. The interconnect structure includes a plurality of metal layers disposed within a dielectric structure. A second substrate, which includes a second handle substrate and a trapping layer, is bonded to an upper surface of the interconnect structure. After bonding, the trapping layer is disposed between the second handle substrate and the upper surface of the interconnect structure. The second handle substrate is then removed to expose a lower surface of the insulating layer.

Still other embodiments relate to a method. In this method, an SOI substrate is provided. The SOI substrate includes a first handle substrate of silicon, an insulating layer disposed over the first handle substrate, and a silicon layer disposed over the insulating layer. The SOI substrate includes a transistor device region and a radio-frequency (RF) region which are spaced laterally apart from one another. An interconnect structure is formed over the SOI substrate. The interconnect structure includes a plurality of metal layers disposed within a dielectric structure. A second substrate, which includes a trapping layer and a second handle substrate made of silicon, is bonded to an upper surface of the interconnect structure. After bonding, the trapping layer separates the second handle substrate from the upper surface of the interconnect structure. The first handle substrate is then removed to expose a lower surface of the insulating layer; and a contact pad is formed in direct contact with a lower surface of the insulating layer. A through-substrate-via (TSV) extends vertically through the silicon layer and through the insulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a substrate comprising a semiconductor layer disposed over an insulating layer;
an interconnect structure disposed over the substrate and including a plurality of metal layers disposed within a dielectric structure;
a handle substrate disposed over and spaced apart from an upper surface of the interconnect structure, the handle substrate including a lower surface comprising a series of silicon peaks; and
a trapping layer of polysilicon material separating the interconnect structure and the handle substrate, wherein the trapping layer has an upper surface comprising first and second polysilicon peaks that matingly engage and directly contact the series of silicon peaks at an interface;
wherein the polysilicon material for each of the first and second polysilicon peaks has multiple grain boundaries that terminate on the interface for each of the first and second polysilicon peaks.

2. The device of claim 1, further comprising:
a contact pad disposed in direct physical contact with a surface of the insulating layer of the substrate; and
a through substrate via extending through the semiconductor layer and the insulating layer and electrically coupling the contact pad to a metal layer of the interconnect structure.

3. The device of claim 1, wherein the handle substrate comprises a silicon substrate.

4. The device of claim 1, wherein a peak has a height ranging from approximately 10 nanometers (nm) to approximately 1 micron and has a width ranging from approximately 10 nm to approximately 10 microns.

5. The device of claim 4, wherein a peak is a flat-topped peak.

6. The device of claim 4, wherein a peak is a rounded peak.

7. The device of claim 4, wherein neighboring peaks have the same heights and/or widths as one another.

8. The device of claim 4, wherein a peak is triangular-shaped, pyramid-shaped, or cone-shaped.

9. The device of claim 1, wherein a first region of the substrate includes a transistor device, and a radio frequency (RF) device is arranged in the interconnect structure over a second region of the substrate and is configured to transmit an RF signal, wherein the trapping layer is configured to trap carriers excited by the RF signal to limit Eddy currents in the handle substrate.

10. The device of claim 1, wherein neighboring peaks have different heights and/or widths as one another.

11. The device of claim 1, further comprising: a packaging layer covering a lower surface of the insulating layer and extending along sidewalls of the device to cover an upper surface of the handle substrate.

12. A device, comprising:
a first substrate comprising a semiconductor layer disposed over an insulating layer;
an interconnect structure disposed over the first substrate and including a plurality of metal layers disposed within a dielectric structure;
a second substrate disposed over an upper surface of the interconnect structure; and
a charge-trapping layer separating the interconnect structure and the second substrate, wherein the charge-trapping layer is made of polysilicon material and meets the second substrate at an interface made up of a series of peaks;
wherein the polysilicon material for each of the series of peaks has multiple grain boundaries that terminate on the interface for each of the series of peaks.

13. The device of claim 12, wherein the series of peaks extend downwardly from the second substrate into the charge-trapping layer.

14. The device of claim 12, wherein the first substrate includes a transistor region and a radio-frequency (RF) region, wherein the RF region includes an RF device arranged in the interconnect structure and configured to transmit an RF signal, wherein the charge-trapping layer is configured to trap carriers excited by the RF signal to limit Eddy currents in the second substrate.

15. The device of claim 12, further comprising: a packaging layer covering a lower surface of the insulating layer and extending along sidewalls of the device to cover an upper surface of the second substrate.

16. The device of claim 12, further comprising:
a contact pad disposed in direct physical contact with a lower surface of the insulating layer of the first substrate; and
a through substrate via extending vertically through the semiconductor layer and through the insulating layer and electrically coupling the contact pad to a metal layer of the interconnect structure.

17. A device, comprising:
an interconnect structure including a plurality of metal layers disposed within a dielectric structure;
a substrate disposed over an upper surface of the interconnect structure; and
a charge-trapping layer comprising polysilicon material separating the interconnect structure and the substrate, wherein the charge-trapping layer meets the substrate at an interface that includes a series of peaks extending downwardly from the substrate into an upper surface of the charge-trapping layer;
wherein the polysilicon material for each of the series of peaks has multiple grain boundaries that terminate on the interface for each of the series of peaks.

18. The device of claim 17, further comprising:
a base substrate comprising a semiconductor layer disposed over an insulating layer, wherein the base substrate includes a transistor device region and a radio-frequency (RF) region;
a contact pad in direct contact with a lower surface of the insulating layer;
wherein the interconnect structure is disposed over the base substrate and includes a plurality of metal layers disposed within a dielectric structure;
a through-substrate-via (TSV) extending vertically through the semiconductor layer and through the insulating layer to couple a metal layer of the interconnect structure to the contact pad;
wherein the interconnect structure is disposed over the base substrate, and separates the base substrate from the substrate.

19. The device of claim 18, wherein the substrate has a different ohmic resistance than the base substrate.

20. The device of claim 19, wherein the base substrate has a first ohmic resistance and the substrate has a second ohmic resistance, the second ohmic resistance being greater than the first ohmic resistance by a factor of ten or more.

* * * * *